United States Patent
Choi et al.

(10) Patent No.: US 7,313,046 B2
(45) Date of Patent: Dec. 25, 2007

(54) SEMICONDUCTOR MEMORY DEVICES IN WHICH THE NUMBER OF MEMORY BANKS TO BE REFRESHED MAY BE CHANGED AND METHODS OF OPERATING THE SAME

(75) Inventors: Sung-ho Choi, Gyeonggi-do (KR); Yun-sang Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 11/214,657

(22) Filed: Aug. 30, 2005

(65) Prior Publication Data
US 2006/0044914 A1    Mar. 2, 2006

(30) Foreign Application Priority Data
Aug. 31, 2004    (KR)    .................. 10-2004-0069096

(51) Int. Cl.
    *G11C 7/00*    (2006.01)
(52) U.S. Cl. ............. 365/222; 365/230.03; 365/230.08
(58) Field of Classification Search ................ 365/222, 365/230.08, 230.03, 230.06
    See application file for complete search history.

(56) References Cited

U.S. PATENT DOCUMENTS

| | | | | |
|---|---|---|---|---|
| 5,822,264 A | * | 10/1998 | Tomishima et al. | ......... 365/222 |
| 5,940,342 A | * | 8/1999 | Yamazaki et al. | ..... 365/230.03 |
| 7,051,260 B2 | * | 5/2006 | Ito et al. | ..................... 714/754 |
| 2003/0185078 A1 | * | 10/2003 | Tsukude | ..................... 365/222 |

FOREIGN PATENT DOCUMENTS

| | | |
|---|---|---|
| JP | 2003-317473 | 11/2003 |
| KR | 10-1997-030229 | 6/1997 |
| KR | 1020020003032 A | 1/2002 |

* cited by examiner

*Primary Examiner*—Son Dinh
(74) *Attorney, Agent, or Firm*—Myers Bigel Sibley & Sajovec (57) ABSTRACT

A semiconductor memory device includes a plurality of memory banks. A refresh control block is responsive to a control address that identifies at least one of the plurality of memory banks to be refreshed. The refresh control block is configured to control refreshing of the at least one of the plurality of memory banks to be refreshed. The control address is used during read and/or write operations of the plurality of memory banks.

25 Claims, 6 Drawing Sheets

SEMICONDUCTOR MEMORY DEVICES IN WHICH THE NUMBER OF MEMORY BANKS TO BE REFRESHED MAY BE CHANGED AND METHODS OF OPERATING THE SAME

This application claims the benefit under 35 USC § 119 of Korean Patent Application No. 2004-69096, filed on Aug. 31, 2004, in the Korean Intellectual Property Office, the disclosure of which is incorporated herein by reference.

BACKGROUND OF THE INVENTION

1. Field of the Invention

The present invention relates generally to semiconductor memory devices, and, more particularly, to dynamic random access memory (DRAM) devices in which the number of memory banks to be refreshed may be changed.

2. Description of the Related Art

Dynamic random access memories (DRAMs) periodically refresh memory cells therein. As memory capacity increases, it generally takes longer to refresh memory cells, and memory banks may not be able to perform other operations while refreshing the memory cells.

In addition, when refreshing all the memory banks at once, a semiconductor memory device may not be able to perform other operations, and refreshing all the memory banks at once may slow down the overall speed of the semiconductor memory device.

Therefore, if a semiconductor memory device includes a plurality of memory banks, it generally refreshes the memory banks one by one. In this case, a memory bank to be refreshed is designated. To this end, an external memory controller generates a bank address indicating the memory bank to be refreshed. The bank address is input to a bank address input terminal of the semiconductor memory device to control the refreshing of the memory bank.

Figure 1:
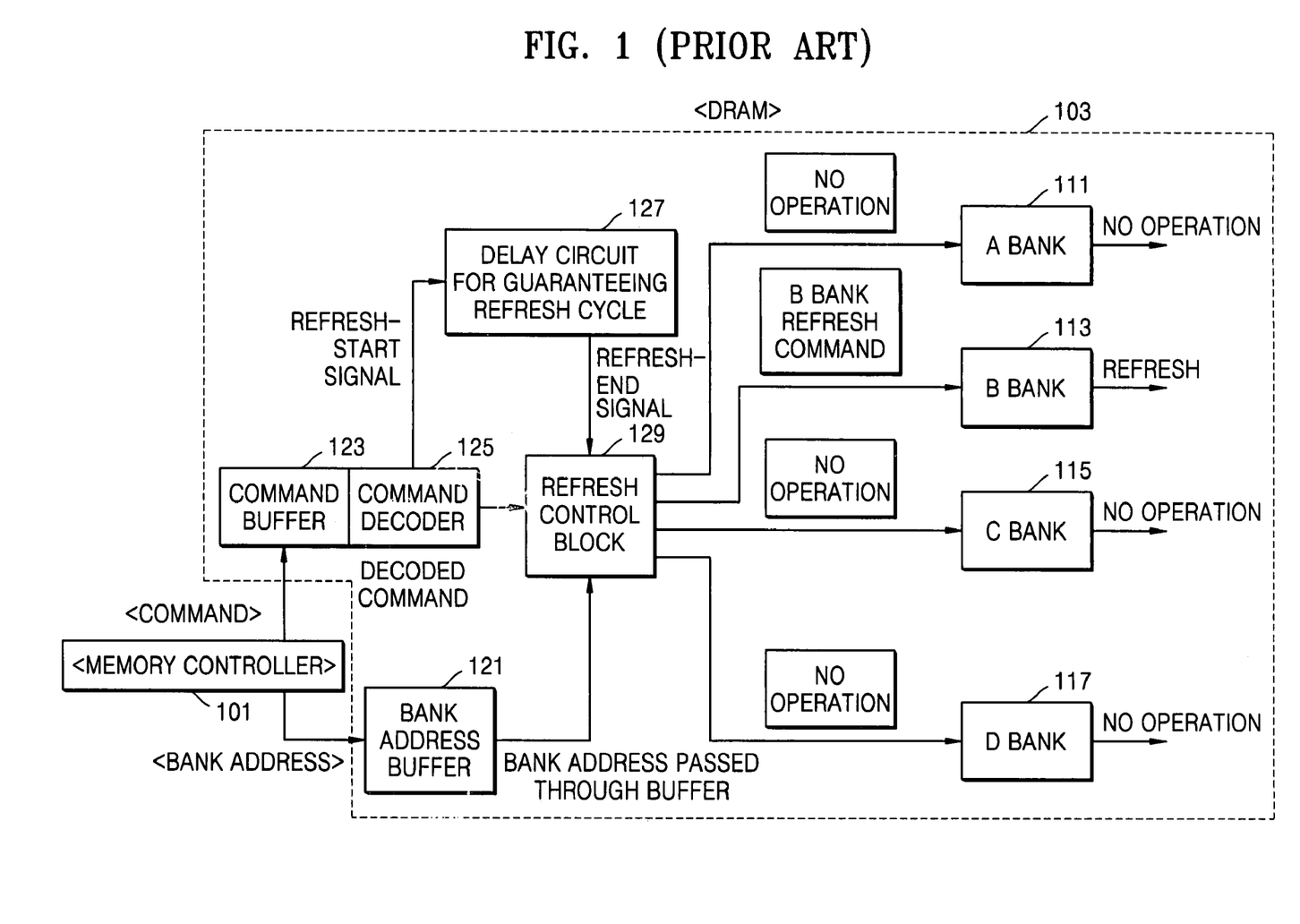
FIG. 1 is a block diagram of a conventional semiconductor memory system performing a refresh operation.

FIG. 1 is a block diagram of a conventional semiconductor memory system performing a refresh operation. Referring to FIG. 1, the semiconductor memory system includes a memory controller 101 and a plurality of DRAMs 103. The memory controller 101 outputs a refresh command signal and an address of a memory bank to be refreshed to the DRAMs 103 such that the DRAMs 103 can refresh the memory bank. Each of the DRAMs 103 includes a plurality of memory banks 111, 113, 115, and 117, a bank address buffer 121, a command buffer 123, a command decoder 125, a delay circuit 127 for guaranteeing a refresh cycle, and a refresh control block 129.

Each of the memory banks 111, 113, 115, and 117 includes a plurality of memory cells to store data and needs to be refreshed to prevent discharging of the data. In the conventional semiconductor memory system, only one memory bank selected by the refresh control block 129 is refreshed while the other memory banks perform other operations. The command buffer 123 receives the refresh command signal from the memory controller 101 and stores the refresh command signal. The command decoder 123 decodes and interprets the refresh command signal.

The delay circuit 127 receives a refresh-start signal from the command decoder 125 and outputs a refresh-stop signal to the control block 129 after a period of time sufficient for the memory bank to be refreshed completely. The refresh control block 129 enables a wordline (W/L) of the memory bank and refreshes the memory bank in response to a bank address output from the bank address buffer 121 and the refresh-start command signal output from the command decoder 125. The refresh control block 129 finishes refreshing the memory bank in response to the refresh-stop signal output from the delay circuit 127.

The number of bank address pins through which bank addresses are input to the DRAMs 103 is fixed. If one of the DRAMs 103 includes four memory banks as illustrated in FIG. 1, there are two bank address pins. Thus, one of the four memory banks can be designated in response to a bank address signal.

Such a method of designating a memory bank to be refreshed using a bank address cannot be used to refresh a plurality of memory banks because only one memory bank is selected. Moreover, because only one memory bank is selected and refreshed, it may take a long time to refresh all the memory banks included in the DRAMs 103. Further, as memory capacity increases, refreshing may take even a longer time. Therefore, it may be difficult to increase the time allotted for other operations of the semiconductor memory system, such as, for example, reading and writing operations.

SUMMARY OF THE INVENTION

According to some embodiments of the present invention, a semiconductor memory device includes a plurality of memory banks. A refresh control block is responsive to a control address that identifies at least one of the plurality of memory banks to be refreshed. The refresh control block is configured to control refreshing of the at least one of the plurality of memory banks to be refreshed. The control address is used during read and/or write operations of the plurality of memory banks.

In other embodiments of the present invention, the refresh control block is responsive to the control address and a bank address that identify the at least one of the plurality of memory banks to be refreshed.

In still other embodiments of the present invention, the control address identifies the at least one of the plurality of memory banks to be refreshed when the semiconductor memory device performs a refresh operation and identifies a memory address of the semiconductor memory device when the semiconductor memory device performs a read and/or write operation.

In still other embodiments of the present invention, the refresh control block includes a bank refresh controller that is configured to control refreshing of the at least one of the plurality of memory banks in response to the control address, a refresh start signal, and a refresh stop signal.

In still other embodiments of the present invention, a number of control address lines associated with the control address is equal to a number of the plurality of memory banks.

In still other embodiments of the present invention, the bank refresh controller includes a plurality of NAND gates that are configured to perform NAND operations on the control address and the refresh start signal. A plurality of NOR gates are respectively connected to the NAND gates and are configured to perform NOR operations on output signals of the respective NAND gates and the refresh stop signal, and output a refresh control signal to the memory banks.

In still other embodiments of the present invention, the refresh control block includes a bank address decoder that is configured to decode the bank address and output a second bank address. A bank selector is configured to receive the control address and the second bank address and output a bank select signal selecting the at least one of the plurality of memory banks to be refreshed. A bank refresh controller is configured to control refreshing of the at least one of the plurality of memory banks in response to the bank select signal, a refresh start signal, and a refresh stop signal.

In still other embodiments of the present invention, the bank selector outputs the bank select signal selecting the at least one of the plurality of memory banks to be refreshed by performing an OR operation on the control address and the second bank address.

In still other embodiments of the present invention, the bank selector comprises a plurality of NOR gates that are configured to perform NOR operations on the control address and the second bank address, and output the bank select signal.

In still other embodiments of the present invention, a number of control address lines associated with the control address and a number of second bank address lines associated with the second bank address are equal to a number of the plurality of memory banks.

In still other embodiments of the present invention, the bank refresh controller includes a plurality of NAND gates that are configured to perform NAND operations on the bank select signal and the refresh start signal. A plurality of NOR gates are respectively connected to the NAND gates and are configured to perform NOR operations on output signals of the respective NAND gates and the refresh stop signal, and output a refresh control signal to the plurality of memory banks.

In still other embodiments of the present invention, the semiconductor memory device is a dynamic random access memory.

In still other embodiments of the present invention, the control address is a column address and/or a row address.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
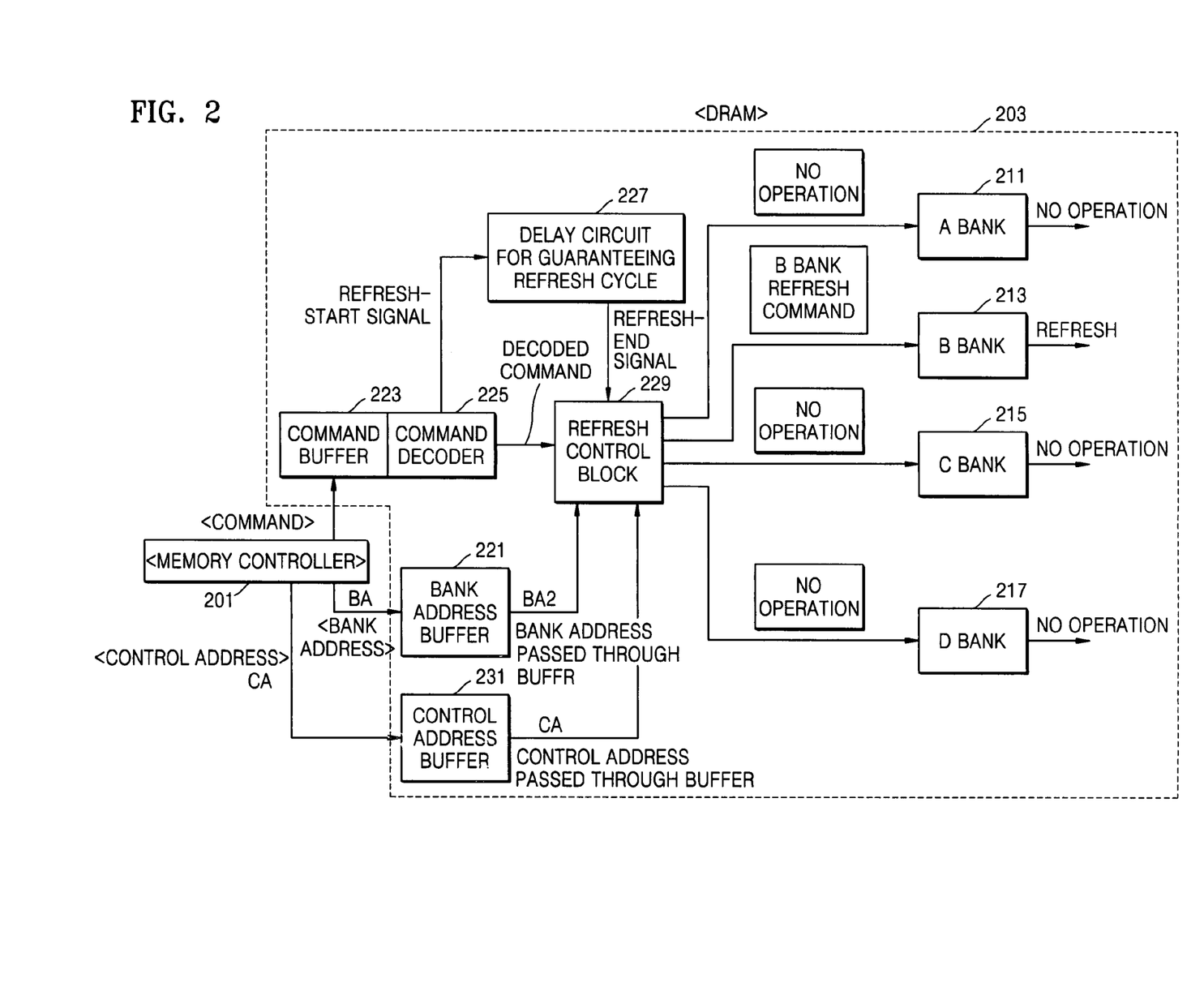
FIG. 2 is a block diagram of a semiconductor memory system performing a refresh operation according to some embodiments of the present invention.

FIG. 2 is a block diagram of a semiconductor memory system performing a refresh operation according to some embodiments of the present invention. Referring to FIG. 2, the semiconductor memory system includes a memory controller 201 and a plurality of DRAMs 203. Each of the DRAMs 203 includes a plurality of memory banks 211, 213, 215, and 217, a bank address buffer 221 used for the refresh operation, a command buffer 223, a command decoder 225, a delay circuit 227 guaranteeing a refresh cycle, a refresh control block 229, and a control address buffer 231.

The memory controller 201 outputs a refresh command as well as a bank address and a control address indicating a memory bank to be refreshed to the DRAMs 203 such that the DRAMs 203 refresh the memory bank. The bank address is input to the refresh control block 229 via the bank address buffer 221 included in each of the DRAMs 203, and the control address is input to the refresh control block 229 via the control address buffer 231 included in each of the DRAMs 203.

The bank address buffer 221 outputs a bank address signal and an inverse bank address signal in response to the bank address and outputs a control address signal and an inverse control address signal in response to the control address input to the control address buffer 231. The command buffer 223 and the command decoder 225 amplify and decode the command signal and output a refresh-start signal to the delay circuit 227.

The delay circuit 227 receives the refresh-start signal from the command decoder 225 and outputs a refresh-stop signal to the refresh control block 229 after a period of time long enough for the memory bank to be refreshed completely. The refresh control block 229 enables a wordline (W/L) of the memory bank and refreshes the memory bank in response to the bank address output from the bank address buffer 221, the control address output from the control address buffer 231, and the refresh-start signal output from the command decoder 225. The refresh control block 229 finishes refreshing the memory bank in response to the refresh-stop signal output from the delay circuit 227.

The semiconductor memory system of FIG. 2 can use a control address as well as a bank address to designate a memory bank to be refreshed. Therefore, the semiconductor memory system can designate a plurality of memory banks at one time to be refreshed as well as on a one-by-one basis. In other words, the number of memory banks to be refreshed can be changed.

The control address in the semiconductor memory system is called a row address and/or a column address. In general, the row address and/or the column address do not indicate particular information when the semiconductor memory system performs the refresh operation. During the refresh operation, if the row address and/or the column address can be used to designate a memory bank to be refreshed, the number of memory banks to be refreshed can be changed.

The control address buffer 231 of FIG. 2 can output as many control address lines as there are memory banks in accordance with some embodiments of the present invention. In other words, if there are four memory banks, four control address lines are connected between the control address buffer 231 and the refresh control block 229, each control address line controlling the selection of a memory bank.

Figure 3:
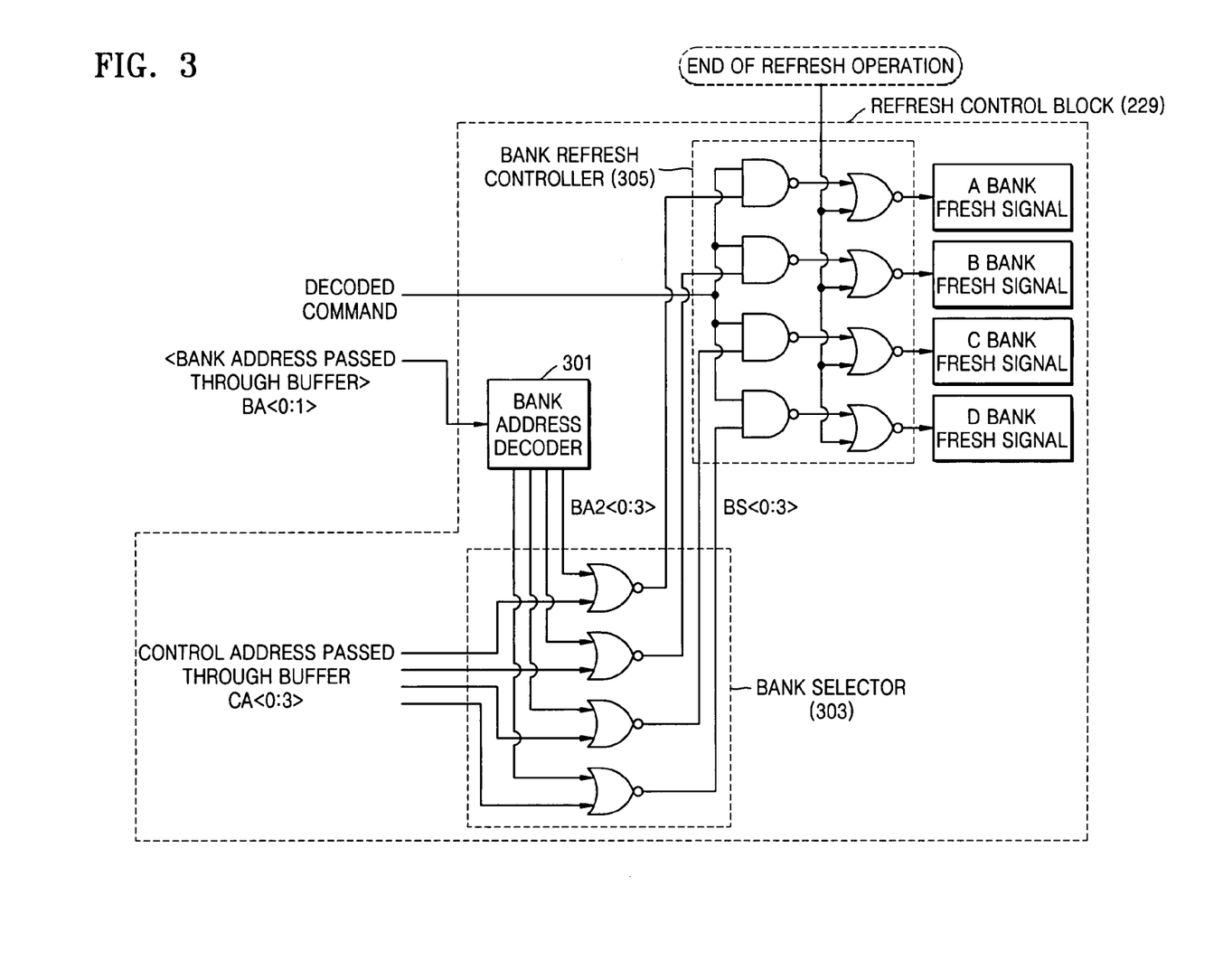
FIG. 3 is a block diagram of a refresh control block illustrated in FIG. 2.

FIG. 3 is a block diagram of the refresh control block 229 illustrated in FIG. 2 in accordance with some embodiments of the present invention. Referring to FIG. 3, the refresh control block 229 includes a bank address decoder 301, a bank selector 303, and a bank refresh controller 305. The bank address decoder 301 decodes a bank address BA<0:1> input via bank address pins (not shown) of the DRAMs 203 and outputs a second bank address BA2<0:3> corresponding to memory banks that correspond to the bank address BA<0:1>. In other words, the bank address BA<0:1> input via two bank address pins is decoded into the second bank address BA2<0:3> corresponding to four memory banks.

The bank selector 303 includes four NOR gates receiving and performing NOR operations on the second bank address BA2<0:3> output from the bank address decoder 301 and a control address CA<0:3> output from the control address buffer 231. In response to a second bank address signal or a control address signal, the bank selector 303 outputs a bank select signal BS<0:3>, which corresponds to the second bank address or control address signal, at a logic high.

Because the bank address BA<0:1> is two-bit data, the second bank address BA2<0:3> can designate a bank address corresponding to a memory bank by setting only one of the four address lines to logic high or logic low. However, the control address CA<0:3> can designate a plurality of memory banks because the number of control address pins may be equal to or greater than the number of memory banks. Therefore, the memory banks to be refreshed can be designated using the control address CA<0:3>. For example, referring to FIG. 2, the second bank address BA2<0:3> cannot be used to select A and C memory banks 211 and 215 at once. However, the control address CA<0:3> can receive a signal "1010" through four control address pins and select the A and C memory banks 211 and 215 at once.

The bank refresh controller 305 includes four NAND gates performing NAND operations on the bank select signal BS<0:3> output from the bank selector 303 and the decoded refresh-start command signal, and four NOR gates performing NOR operations on an output of the corresponding NAND gates and the refresh-stop command signal output from the delay circuit 227. The NAND gates perform the NAND operations and output the bank select signal BS<0:3> to a memory bank only in response to the refresh command. Therefore, during a reading or writing operation of a semiconductor memory device, a bank refresh signal transmitted to the memory bank is not enabled regardless of the state of the bank select signal BS<0:3>.

In other words, during a reading or writing operation, the control address CA<0:3> is address information indicating memory cells in the semiconductor memory device. Even if the bank selector 303 receives the address information and outputs the address information to the bank refresh controller 305, the address information is meaningless because it does not designate a memory bank because the refresh-start command signal is at a logic low level. However, during the refresh operation, the memory controller 201 outputs the control address information indicating a memory bank to be refreshed and, at the same time, the refresh command signal. Thus, the bank select signal BS<0:3> input to the bank refresh controller 305 is transmitted to the memory bank to control refreshing of the memory bank.

The bank refresh controller 305 includes a plurality of NOR gates for performing the NOR operations on respective outputs of the NAND gates and the refresh-stop command signal. If the refresh-stop signal is received after the end of a refresh cycle, the bank refresh controller 305 disables the refresh signal for each of the memory banks such that the refreshing of each of the memory banks is terminated.

In other words, in the semiconductor memory system according to some embodiments of the present invention, a control address transmitted to the memory controller 201 indicates a memory bank to be refreshed during the refresh operation and indicates positions of memory cells during a reading or writing operation. Therefore, a plurality of memory banks can be selected using the control address which has a greater number of pins associated therewith than the number of pins used for the bank address BA. In the embodiment of FIGS. 2 and 3, two pins are used for the bank address BA while four pins are used for the control address CA. As the number of memory banks increases, the number of bank address pins and control address pins may increase.

As illustrated in FIGS. 2 and 3, if both the bank address and the control address are used, the number of control addresses equal to the number of memory banks can be subtracted from the total number of control addresses, and the remaining control addresses can be used for indicating a memory bank to be refreshed.

Figure 4:
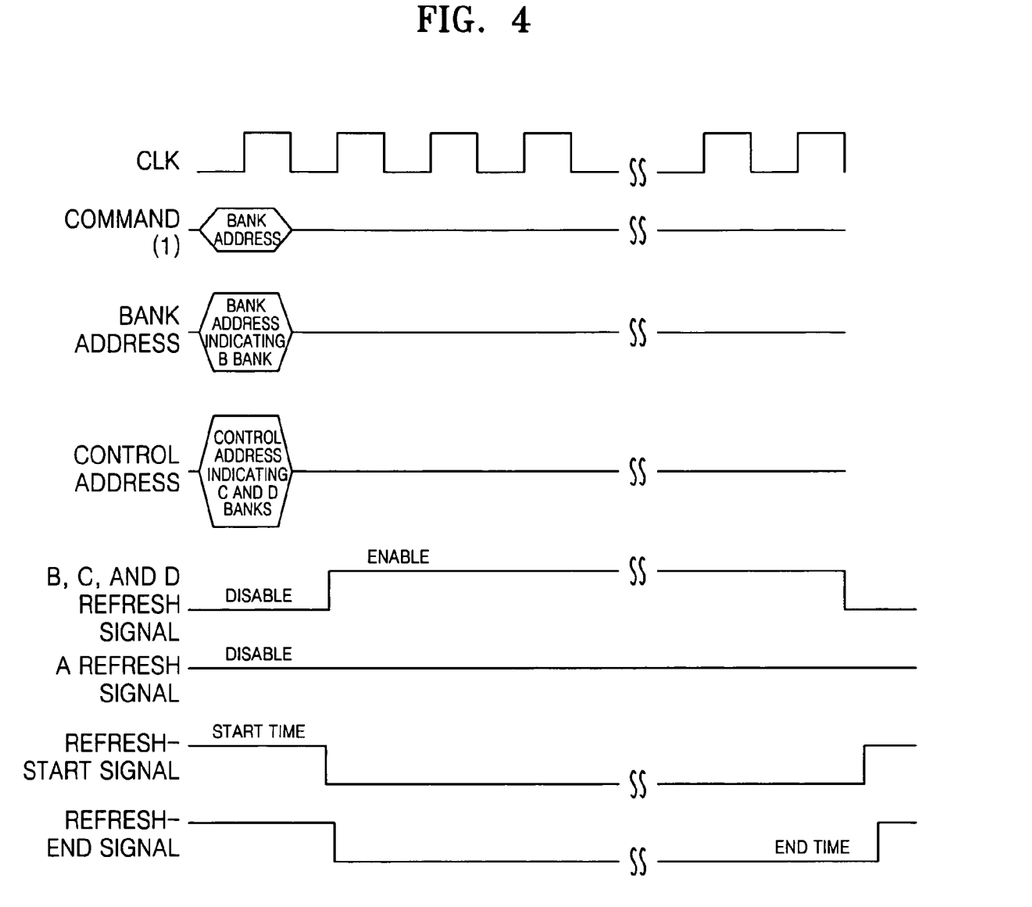
FIG. 4 is a timing diagram illustrating a refresh operation according to some embodiments of the present invention.

FIG. 4 is a timing diagram illustrating refresh operations in accordance with some embodiments of the present invention. Referring to FIG. 4, the memory controller 201 generates a bank refresh command and, at the same time, transmits a bank address and a control address indicating memory banks to be refreshed to the memory device. After receiving the bank address identifying the B bank 213 and the control address identifying the C and D banks 215 and 217, the bank refresh controller 305 enables B, C, and D bank refresh signals while disabling an A bank refresh signal. If the refresh-start signal transitions to logic low, the refresh operation is started, and after the end of a refresh cycle, the refresh-stop signal transitions to logic high, thereby terminating the refresh operation.

The timing diagram of FIG. 4 is based on the circuit diagram of FIG. 3. In accordance with various embodiments of the present invention, if the logic configuration in FIG. 3 is changed, logic levels of the signals may be changed accordingly.

Figure 5:
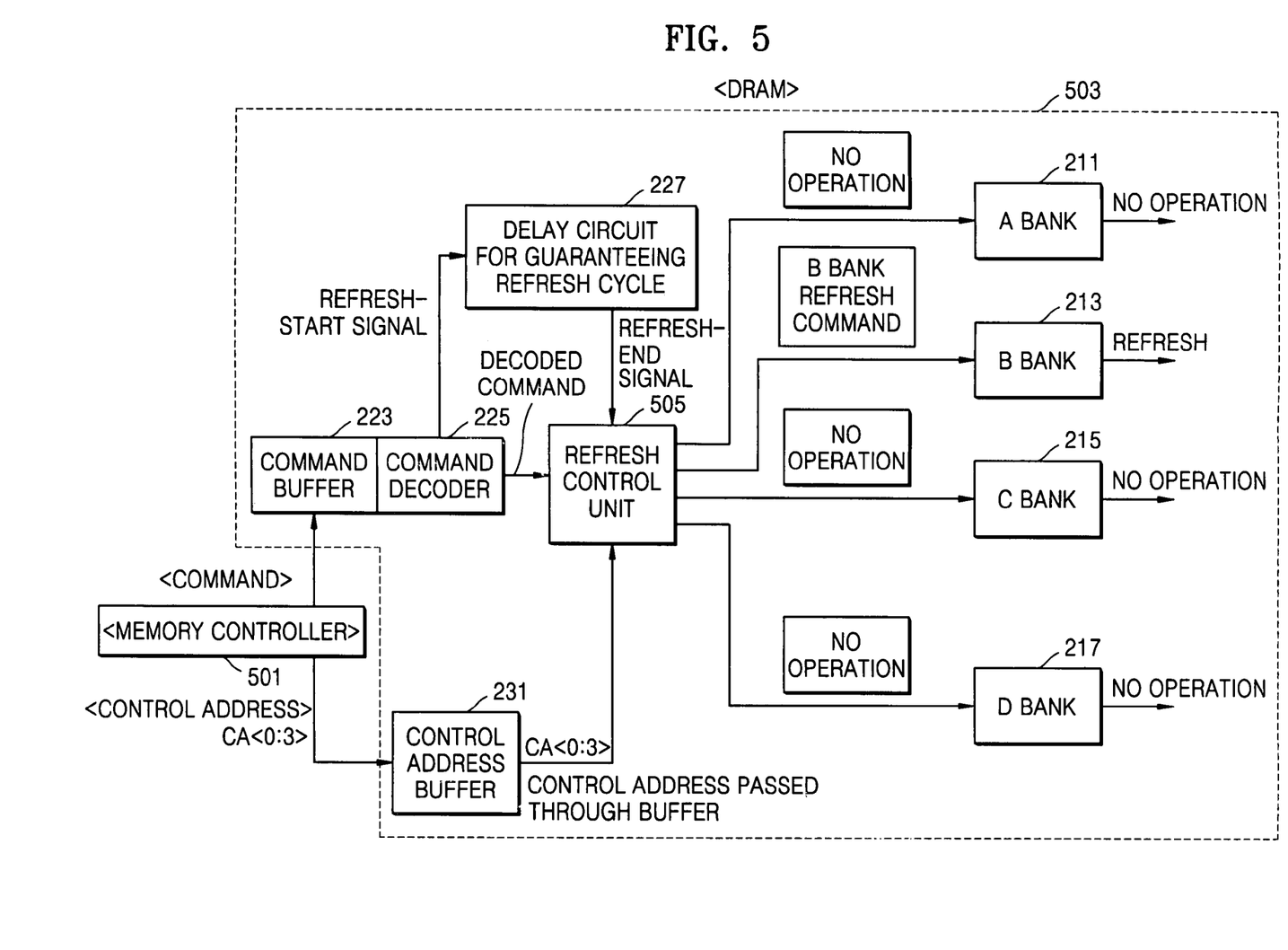
FIG. 5 is a block diagram of a semiconductor memory system performing a refresh operation according to other embodiments of the present invention.

FIG. 5 is a block diagram of a semiconductor memory system performing a refresh operation according further embodiments of the present invention. The semiconductor memory system of FIG. 5 is similar to that of FIG. 2. However, a memory controller 501 in FIG. 5 transmits a control address CA<0:3> but not a bank address. The bank address buffer 221 illustrated in FIG. 2 is not included in DRAMs 503.

In other words, in FIG. 5, only the control address CA<0:3> is used to designate a memory bank to be refreshed. The memory controller 501 outputs a refresh command and the control address CA<0:3> indicating a memory bank to be refreshed such that the DRAMs 503 performs the refresh operations. The control address CA<0:3> is input to a refresh control block 505 via a control address buffer 231.

The refresh control block 505 enables a wordline of the memory bank to be selected and refreshes the memory bank in response to the control address CA<0:3> output from the control address buffer 231 and the refresh-start command output from the command decoder 225 and terminates refreshing of the memory bank in response to the refresh-stop signal output from the delay circuit 227.

To designate a memory bank to be refreshed, the semiconductor memory system of FIG. 5 uses the control address CA<0:3> that is not used in refresh operations in conventional semiconductor memory devices. Not all control address lines available to designate a memory bank need to be used because the memory banks can be designated by only some of the control address lines.

In conventional semiconductor memory devices, the control address CA<0:3> does not indicate particular control information when the semiconductor memory device performs a refresh operation. During a refresh operation according to some embodiments of the present invention, if the control address CA<0:3> can be used to designate a memory bank to be refreshed, then multiple memory banks can be refreshed at once. Consequently, it is possible to designate the memory banks one by one as well as all at once.

Figure 6:
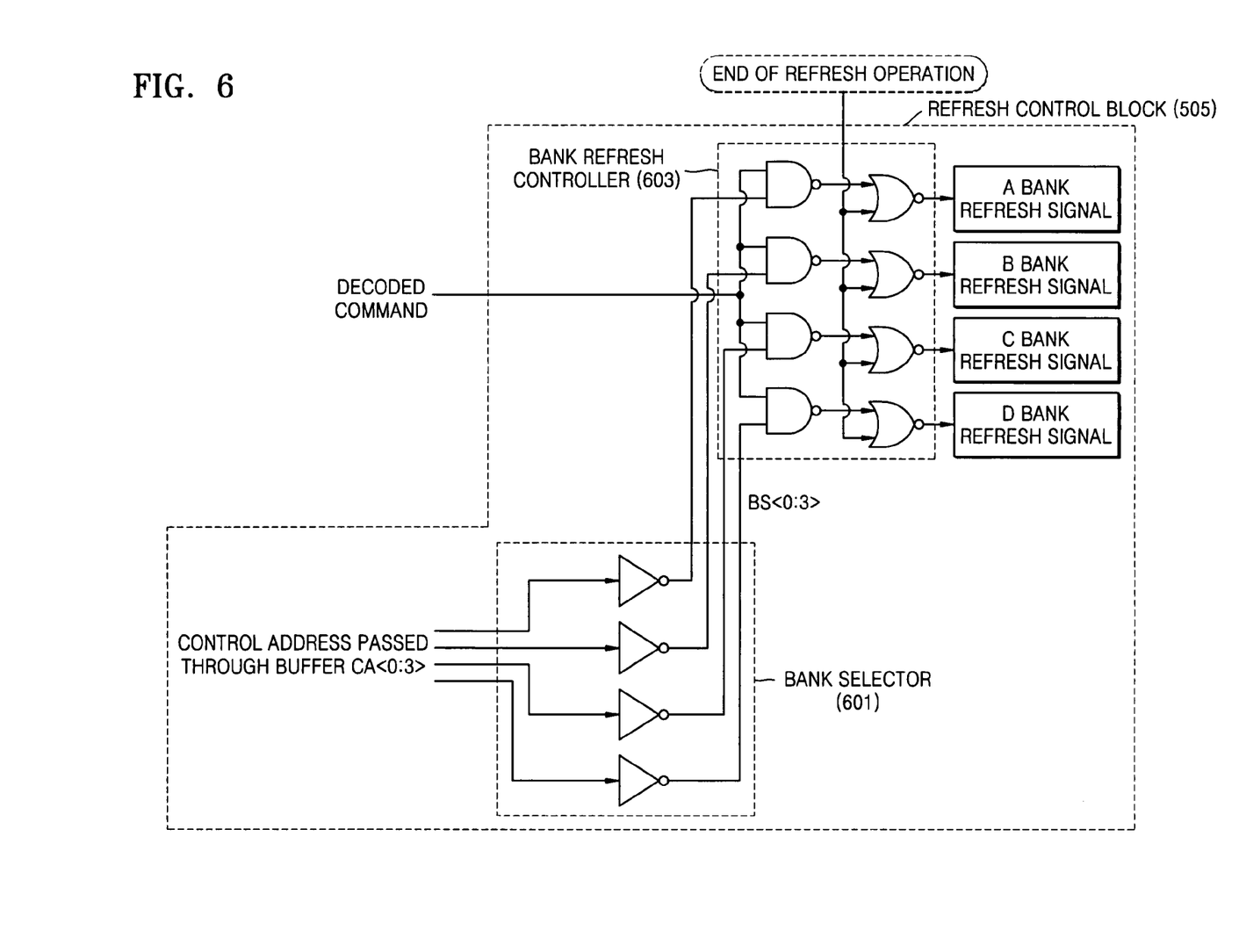
FIG. 6 is a block diagram of a refresh control block illustrated in FIG. 5.

FIG. 6 is a block diagram of the refresh control block 505 illustrated in FIG. 5. Referring to FIG. 6, the refresh control block 505 includes a bank selector 601 and a bank refresh controller 603. The bank selector 601 receives the control address CA<0:3> via the control address buffer 231 and outputs a bank select address BS<0:3> corresponding to a plurality of memory banks. As illustrated in FIG. 6, the bank selector 601 may include a plurality of inverters inverting the control address CA<0:3> according to the circuit configuration of the refresh control block 505.

The bank refresh controller 603 includes four NAND gates performing NAND operations on the bank select signal BS<0:3> output from the bank selector 601 and the decoded refresh-start command signal, and four NOR gates performing the NOR operations on outputs of the respective NAND gates and the refresh-stop command signal output from the delay circuit 227. The NAND gates perform the NAND operations such that the bank select signal BS<0:3> is output to memory banks only in response to the refresh command. Therefore, during a reading or writing operation of the semiconductor memory device, the bank refresh signal transmitted to the memory bank is not enabled regardless of the state of the bank select signal BS<0:3>.

During a reading or writing operation, the control address CA<0:3> is address information identifying memory cells in the semiconductor memory device. Even if the bank selector 601 receives the address information and outputs the address information to the bank refresh controller 603, the address information is meaningless because it does not designate memory banks because the refresh-start command signal is at a logic low level. However, during a refresh operation, the memory controller 501 outputs the control address information identifying memory banks to be refreshed and, at the same time, the refresh command signal. Thus, the bank select signal BS<0:3> input to the bank refresh controller 603 is transmitted to each of the memory banks to control refreshing of the memory banks.

The bank refresh controller 603 includes a plurality of NOR gates for performing NOR operations on respective outputs of the NAND gates and the refresh-stop command signal. If the refresh-stop signal is received after the end of a refresh cycle, the bank refresh controller 603 disables the refresh signal for each of the memory banks such that refreshing of the memory banks is terminated.

Thus, according to some embodiments of the present invention, a memory bank to be refreshed can be designated using a control address pin/signal, not a plurality of bank address pins/signals. In addition, the number of memory banks to be refreshed can be greater than one because a plurality of memory banks can be designated.

A semiconductor memory device according to some embodiments of the present invention can change the number of memory banks to be refreshed during a refresh operation by using a control address. In addition, the time allotted to refresh the semiconductor memory device in a semiconductor system can be reduced or adjusted, thereby enhancing the overall performance of the semiconductor system.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A semiconductor memory device, comprising:
a plurality of memory banks; and
a refresh control block that is responsive to a control address that identifies at least one of the plurality of memory banks to be refreshed and is configured to control refreshing of the at least one of the plurality of memory banks to be refreshed, the refresh control block being operable to control refreshing of one of the plurality of memory banks individually and multiple ones of the plurality of memory banks in parallel based on the control address, the control address being further used during read and/or write operations of the plurality of memory banks.

2. The device of claim 1, wherein the refresh control block is responsive to the control address and a bank address that identify the at least one of the plurality of memory banks to be refreshed and is configured to control refreshing of the at least one of the plurality of memory banks to be refreshed.

3. The device of claim 1, wherein the control address identifies the at least one of the plurality of memory banks to be refreshed when the semiconductor memory device performs a refresh operation and identifies a memory address of the semiconductor memory device when the semiconductor memory device performs a read and/or write operation.

4. The device of claim 1, wherein the refresh control block comprises:
a bank refresh controller that is configured to control refreshing of the at least one of the plurality of memory banks in response to the control address, a refresh start signal, and a refresh stop signal.

5. The device of claim 4, wherein a number of control address lines associated with the control address is equal to a number of the plurality of memory banks.

6. The device of claim 4, wherein the bank refresh controller comprises:
   a plurality of NAND gates that are configured to perform NAND operations on the control address and the refresh start signal; and
   a plurality of NOR gates that are respectively connected to the NAND gates and are configured to perform NOR operations on output signals of the respective NAND gates and the refresh stop signal, and output a refresh control signal to the memory banks.

7. The device of claim 2, wherein the refresh control block comprises:
   a bank address decoder that is configured to decode the bank address and output a second bank address;
   a bank selector that is configured to receive the control address and the second bank address and output a bank select signal selecting the at least one of the plurality of memory banks to be refreshed; and
   a bank refresh controller that is configured to control refreshing of the at least one of the plurality of memory banks in response to the bank select signal, a refresh start signal, and a refresh stop signal.

8. The device of claim 7, wherein the bank selector outputs the bank select signal selecting the at least one of the plurality of memory banks to be refreshed by performing an OR operation on the control address and the second bank address.

9. The device of claim 7, wherein the bank selector comprises a plurality of NOR gates that are configured to perform NOR operations on the control address and the second bank address, and output the bank select signal.

10. The device of claim 7, wherein a number of control address lines associated with the control address and a number of second bank address lines associated with the second bank address are equal to a number of the plurality of memory banks.

11. The device of claim 7, wherein the bank refresh controller comprises:
   a plurality of NAND gates that are configured to perform NAND operations on the bank select signal and the refresh start signal; and
   a plurality of NOR gates that are respectively connected to the NAND gates and are configured to perform NOR operations on output signals of the respective NAND gates and the refresh stop signal, and output a refresh control signal to the plurality of memory banks.

12. The device of claim 1, wherein the semiconductor memory device is a dynamic random access memory.

13. The device of claim 1, wherein the control address is a column address and/or a row address.

14. A semiconductor memory system, comprising:
   a memory controller that is configured to generate a refresh command and a control address; and
   a plurality of semiconductor memory devices, each of the semiconductor memory devices comprising a plurality of memory banks and a refresh control block that is responsive to the control address and the refresh command that identifies at least one of the plurality of memory banks to be refreshed and is configured to control refreshing of the at least one of the plurality of memory banks to be refreshed, the refresh control block being operable to control refreshing of one of the plurality of memory banks individually and multiple ones of the plurality of memory banks in parallel based on the control address, the control address being further used during read and/or write operations of the plurality of memory banks.

15. The system of claim 14, wherein each of the semiconductor memory devices further comprises a control address buffer that is configured to temporarily store the control address output from the memory controller.

16. The system of claim 14, wherein the memory controller is further configured to generate a bank address, and wherein the refresh control block is responsive to the control address and the bank address that identify the at least one of the plurality of memory banks to be refreshed and is configured to control refreshing of the at least one of the plurality of memory banks to be refreshed.

17. The system of claim 16, wherein the memory controller is further configured to generate the bank address to identify one of the plurality of memory banks to be refreshed and to generate the control address to identify multiple ones of the plurality of memory banks to be refreshed.

18. The system of claim 14, wherein the refresh control block comprises a bank refresh controller that is configured to control refreshing of the at least one of the plurality of memory banks in response to the control address, a refresh start signal, and a refresh stop signal.

19. The system of claim 16, wherein the refresh control block comprises:
   a bank address decoder that is configured to decode the bank address and output a second bank address;
   a bank selector that is configured to receive the control address and the second bank address and output a bank select signal selecting the at least one of the plurality of memory banks to be refreshed; and
   a bank refresh controller that is configured to control refreshing of the at least one of the plurality of memory banks in response to the bank select signal, a refresh start signal, and a refresh stop signal.

20. The system of claim 14, wherein the control address identifies the at least one of the plurality of memory banks to be refreshed when the semiconductor memory device performs a refresh operation and identifies a memory address of the semiconductor memory device when the semiconductor memory device performs a read and/or write operation.

21. A method of operating a semiconductor memory device, comprising:
   generating a control address that identifies at least one of a plurality of memory banks to be refreshed, the control address indicating whether to refresh one of the plurality of memory banks individually or multiple ones of the plurality of memory banks in parallel, and being used during read and/or write operations of the plurality of memory banks; and
   refreshing the at least one of the plurality of memory banks responsive to the control address.

22. The method of claim 21, wherein generating the control address comprises generating the control address and a bank address that identify the at least one of the plurality of memory banks to be refreshed, and wherein refreshing the at least one of the plurality of memory banks comprises refreshing the at least one of the plurality of memory banks responsive to the control address and the bank address.

23. The method of claim 21, wherein the control address identifies the at least one of the plurality of memory banks to be refreshed when the semiconductor memory device performs a refresh operation and identifies a memory address of the semiconductor memory device when the semiconductor memory device performs a read and/or write operation.

24. The method of claim 21, wherein the semiconductor memory device is a dynamic random access memory.

25. The method of claim 21, wherein the control address is a column address and/or a row address.

* * * * *